United States Patent
Liu et al.

(10) Patent No.: US 7,471,131 B2
(45) Date of Patent: Dec. 30, 2008

(54) DELAY LOCKED LOOP WITH COMMON COUNTER AND METHOD THEREOF

(75) Inventors: Zhongding Liu, Beijing (CN); Zhen-Yu Song, Beijing (CN); Ken-Ming Li, Taipei (TW); Joe Bi, Beijing (CN); Sally Qu, Beijing (CN)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 11/468,359

(22) Filed: Aug. 30, 2006

(65) Prior Publication Data
US 2007/0046348 A1    Mar. 1, 2007

(30) Foreign Application Priority Data
Aug. 31, 2005    (TW) ................ 94129896 A

(51) Int. Cl.
*H03L 7/06* (2006.01)
(52) U.S. Cl. ........................ 327/158; 327/149
(58) Field of Classification Search ........................ None
See application file for complete search history.

(56) References Cited

U.S. PATENT DOCUMENTS

| | | | | |
|---|---|---|---|---|
| 5,604,775 A * | 2/1997 | Saitoh et al. | ................ | 375/376 |
| 6,281,726 B1 * | 8/2001 | Miller, Jr. | ................ | 327/156 |
| 6,316,980 B1 * | 11/2001 | Vogt et al. | ................ | 327/273 |
| 6,346,837 B1 | 2/2002 | Shibayama | | |
| 6,351,165 B1 * | 2/2002 | Gregorian et al. | ........... | 327/156 |
| 6,400,197 B2 * | 6/2002 | Lai et al. | ................ | 327/161 |
| 6,437,618 B2 | 8/2002 | Lee | | |
| 6,525,585 B1 * | 2/2003 | Iida et al. | ................ | 327/279 |
| 6,586,978 B2 | 7/2003 | Stief | | |
| 6,633,190 B1 * | 10/2003 | Alvandpour et al. | ........ | 327/291 |
| 6,639,958 B1 * | 10/2003 | Hohler et al. | ................ | 375/376 |
| 6,750,688 B2 * | 6/2004 | Takai | ................ | 327/158 |
| 6,946,872 B1 * | 9/2005 | Pan et al. | ................ | 326/41 |
| 7,227,809 B2 * | 6/2007 | Kwak | ................ | 365/233 |
| 7,234,069 B1 * | 6/2007 | Johnson | ................ | 713/400 |

FOREIGN PATENT DOCUMENTS

| | | |
|---|---|---|
| CN | 1404224 | 3/2003 |
| CN | 2596675 | 12/2003 |
| TW | 518594 | 1/2003 |

OTHER PUBLICATIONS

TW Office Action mailed Apr. 22, 2008.

* cited by examiner

*Primary Examiner*—Cassandra Cox
(74) *Attorney, Agent, or Firm*—Thomas, Kayden, Horstemeyer & Risley

(57) ABSTRACT

A delay locked loop circuit for delaying an input clock to lock a delay clock. The delay locked loop includes a frequency divider for dividing a frequency of the input clock by a number N to obtain a frequency-divided clock, a plurality of delay components for delaying the input clock to generate a plurality of delay clocks with different phase according to a count value, a phase detector coupled to a final delay components for detecting a phase transition between a final delay clock and the input clock, and a counter coupled to the phase detector and the frequency divider for generating the count value according to the phase transition between the final delay clock and the input clock.

12 Claims, 3 Drawing Sheets

DELAY LOCKED LOOP WITH COMMON COUNTER AND METHOD THEREOF

BACKGROUND OF THE INVENTION

1. Field of the Invention

The invention relates to a delay locked loop, and more particularly to a delay locked loop with a common counter.

2. Description of the Related Art

The delay locked loop (DLL) is commonly utilized in computer environments for generating a required clock. If the needed clock rate increases, the low-skew clock distributions become important. The related computer environments include processors communicating with various kinds of memory devices and input/output devices. Taking the synchronous dynamic random access memory device (SDRAM) as an example, the data transfer rate is almost equal to that of the processors. In a DDR memory application, data is output from a DDR SDRAM to a memory controller at both rising and falling edges of a clock cycle. The DLL in the memory controller is designed to generate a delayed clock according to a memory clock for delaying the timing of input clock. In other words, the DLL provides a delay quantity to shift the rising or falling edges and the memory controller can store correct data in the latch device.

Please refer to FIG. 1. FIG. 1 is a block diagram of a related delay locked loop (DLL). The DLL 100 includes a multiplexer (MUX) 102, a frequency divider 104, an inverter 105, a phase detector 106, a counter 108, and a delay component 110. For example, a delay clock whose frequency is equal to 500 MHz is chosen and the DLL 100 needs to lock the delay clock to lag 90 degrees behind an input clock. A detailed description of locking the delay clock is provided in the following.

Assume that the MUX 102 chooses the clock CLK1 as the input clock IN whose frequency is equal to 1 GHz. The inverter 105 inverts the input clock IN to generate the reference clock REFCLK. The delay component 110 includes a plurality of delay chains. Different delay chains correspond to different operational bands of the input clock. In other words, the delay component 110 is a broadband delay component. The delay component 110 provides a predetermined delay quantity dt to the input clock $CLK_1$ to output the delay clock FBCLK. The selecting signal SEL is utilized to select one delay chain. In this case, the length of the selecting signal SEL[1:0] is two bits and the selecting signal SEL[1:0] can select one of four different delay chains corresponding to different frequencies of the input clock. The phase detector 106 compares the phases of the delay clock FBCLK and the reference clock REFCLK. If the phase of the reference clock REFCLK leads, the up signal UP is triggered once. The counter 108 receives the up signal UP and adds the count value DCNT[7:0] by one when catching an edge (rising or falling) of the frequency-divided clock CNTCLK4. The frequency-divided clock CNTCLK4 is output from the frequency divider 104 and the period of the frequency-divided clock CNTCLK4 is four times greater than that of the input clock $CLK_1$ since the frequency of the frequency-divided clock CNTCLK4 is divided by four. Please note that the dividing value is not limited to the value four, the dividing value can be eight or sixteen for example. The counter 108 continues counting to control the delay component 110 to increase the delay quantity dt until the phase of the delay clock lags 180 degrees behind the phase of the input clock. Once the phase of the delay clock lags by 180 degrees, the related DLL 100 is locked and the frequency of the input clock is changed from 1 GHz to 500 MHz. After changing the input clock to 500 MHz, the delay clock lags 90 degrees behind the input clock (the frequency is 500 MHz). In other words, each time the related DLL 100 generates the delay clock, the operating frequency of the input clock will be increased by two (e.g. from 500 MHz to 1 GHz) in the beginning, and recovered again (e.g. from 1 GHz to 500 MHz) when the DLL 100 is locked. This is not only time consuming but also difficult particularly when the operating frequency of the input clock is high. Additionally, the broadband delay component and the counter may not operate normally when the operating frequency of the input clock is high. In other words, the common counter may operate abnormally in some high bands.

BRIEF SUMMARY OF THE INVENTION

A detailed description is given in the following embodiments with reference to the accompanying drawings.

The invention provides a delay locked loop circuit for delaying an input clock to lock a delay clock. The delay locked loop includes a frequency divider for dividing a frequency of the input clock by a number N to obtain a frequency-divided clock, a plurality of delay components for delaying the input clock to generate a plurality of delay clocks with different phase according to a count value, a phase detector coupled to a final delay component for detecting a phase transition between a final delay clock and the input clock, and a counter coupled to the phase detector and the frequency divider for generating the count value according to the phase transition between the final delay clock and the input clock.

The invention further provides a broadband delay component for delaying an input clock to generate a delay clock according to a count value. The broadband delay component includes a decoder for decoding the count value to generate a decoded signal, a plurality of code detectors for respectively detecting the count value to generate a plurality of detected signals, a plurality of delay chains respectively coupled to the decoder and the plurality of code detectors for delaying the input clock according to the plurality of detected signals and the decoded signal to generate a plurality of temporary delay clocks corresponding to different delay quantities, a MUX coupled to the decoder and the plurality of delay chains for choosing one of the plurality of temporary delay clocks according to the decoded signal as the delay clock corresponding to the frequency of the input clock, and an output buffer coupled to the MUX for outputting the delay clock.

The invention further provides a method for delaying an input clock to lock a delay clock. The method includes: dividing a frequency of the input clock by a number N to obtain a frequency-divided clock; delaying the input clock to generate a plurality of delay clocks with different phases according to a count value; detecting a phase transition between a final delay clock of the delay clocks and the input clock; generating the count value according to the phase transition between the final delay clock and the input clock.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
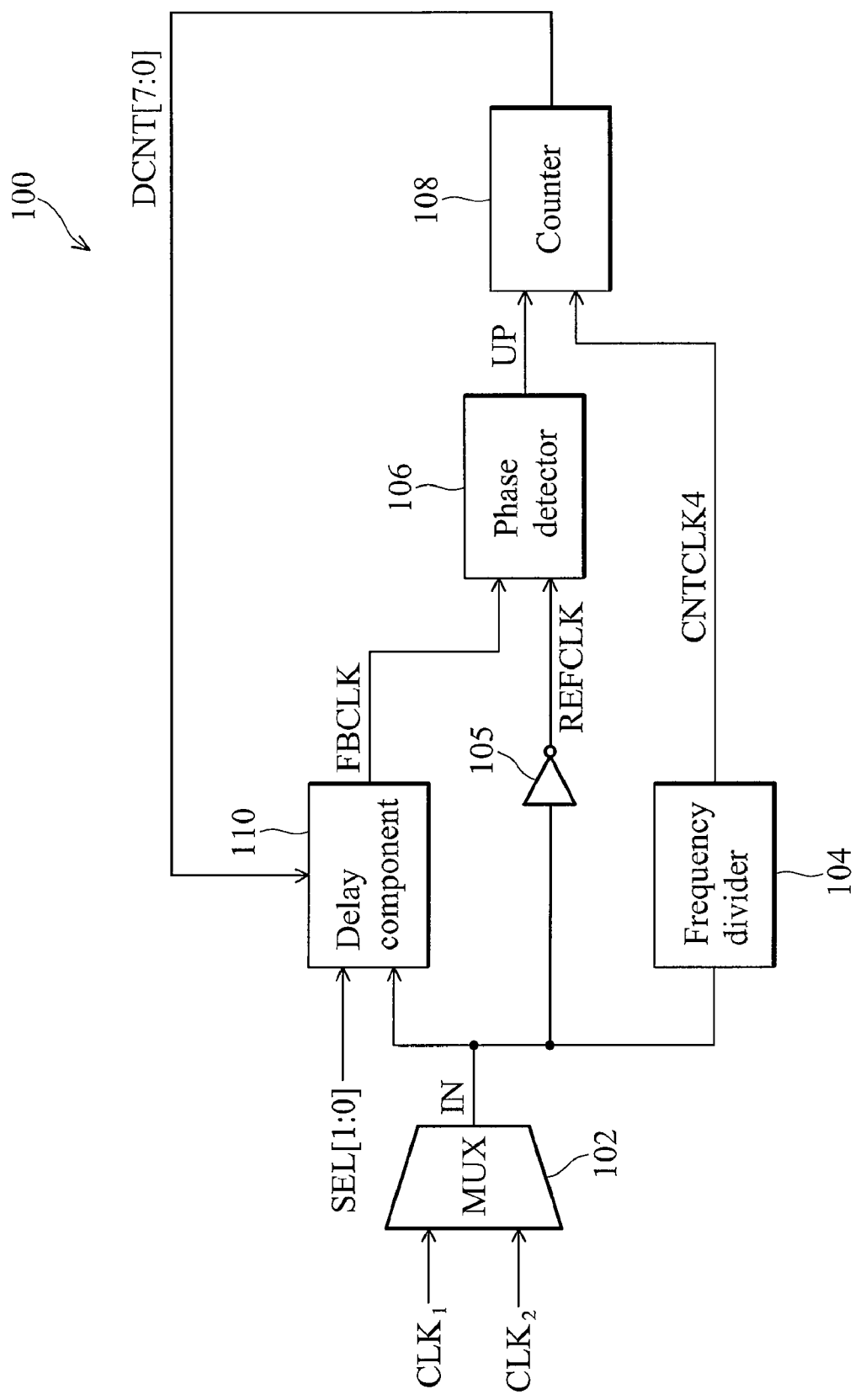
FIG. 1 is a block diagram of a related delay locked loop.
Figure 2:
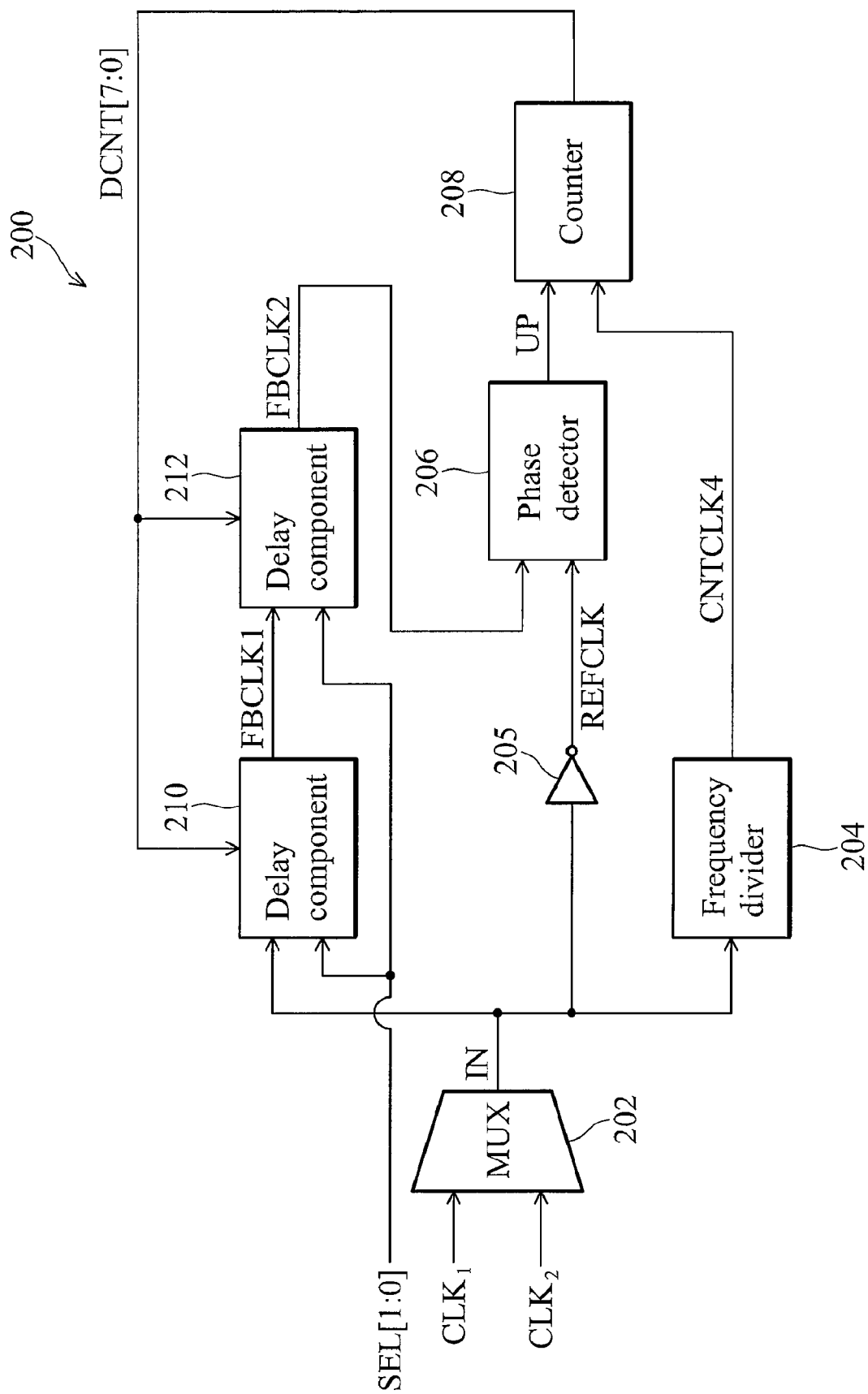
FIG. 2 is a block diagram of an embodiment of a delay locked loop with a common counter.

FIG. 2 is a block diagram of an embodiment of a delay locked loop (DLL) with a common counter. The DLL 200 includes a MUX 202, a frequency divider 204, an inverter 205, a phase detector 206, a counter 208, and a plurality of delay components 210 and 212. With the help of the improved delay components 210 and 212, the DLL 200 operates normally in the broadband environment with a common counter 208. A detailed description of the improved delay components 210 and 212 will be provided later. For example, a delay clock with a frequency equal to 500 MHz is chosen and the DLL 200 needs to lock the delay clock to lag 90 degrees behind the input clock. A detailed description of locking the delay clock is provided in the following.

Assume that the MUX 202 chooses the clock CLK1 as the input clock IN with a frequency equal to 500 MHz. The inverter 205 inverts the input clock IN to generate the reference clock REFCLK. Each delay component includes a plurality of delay chains. Different delay chains correspond to different operational bands of the input clock. In other words, the delay component is a broadband delay component. The delay components 210 and 212 provide a predetermined delay quantity dt to the input clock IN to output the delay clock FBCLK2. The selecting signal SEL is utilized to select one delay chain. In this embodiment, the length of the selecting signal SEL[1:0] is two bits and the selecting signal SEL[1:0] can select one of four different delay chains corresponding to different frequencies of the input clock. The phase detector 206 compares the phases of the delay clock FBCLK2 and the reference clock REFCLK. If the phase of the reference clock REFCLK leads, the up signal UP is triggered once. The counter 28 receives the up signal UP and adds the count value DCNT[7:0] by one when catching an edge (rising or falling) of the frequency-divided clock CNTCLK4. The frequency divider 204 outputs the frequency-divided clock CNTCLK4 having a period four times larger than that of the input clock IN since its frequency is divided by four. Please note that the dividing value is not limited by the value four. The counter 208 continues counting to control the delay components 210 and 212 to increase the delay quantity dt until the phase of the delay clock FBCLK2 from the delay component 212 lags 180 degrees behind the phase of the input clock. Once the phase of the delay clock lags by 180 degrees, the DLL 200 is locked and the delay FBCLK1 lags 90 degrees behind the input clock.

It is obvious that the DLL 200 of the invention does not need to increase the operating frequency of the input clock twice in the beginning and the delay clock from the first component (the delay component 210 in this embodiment) outputs the desired delay clock that lags 90 degrees behind when the DLL 100 is locked. Additionally, the delay clock from the delay component 212 lags 180 degrees behind.

A detailed description of the improved delay components 210 and 212 is provided in the following. The improved delay components can be utilized in a broadband environment with a common counter. The operation and configuration of each delay component is the same and the delay component 210 is taken as an example to be further described in the following.

Figure 3:
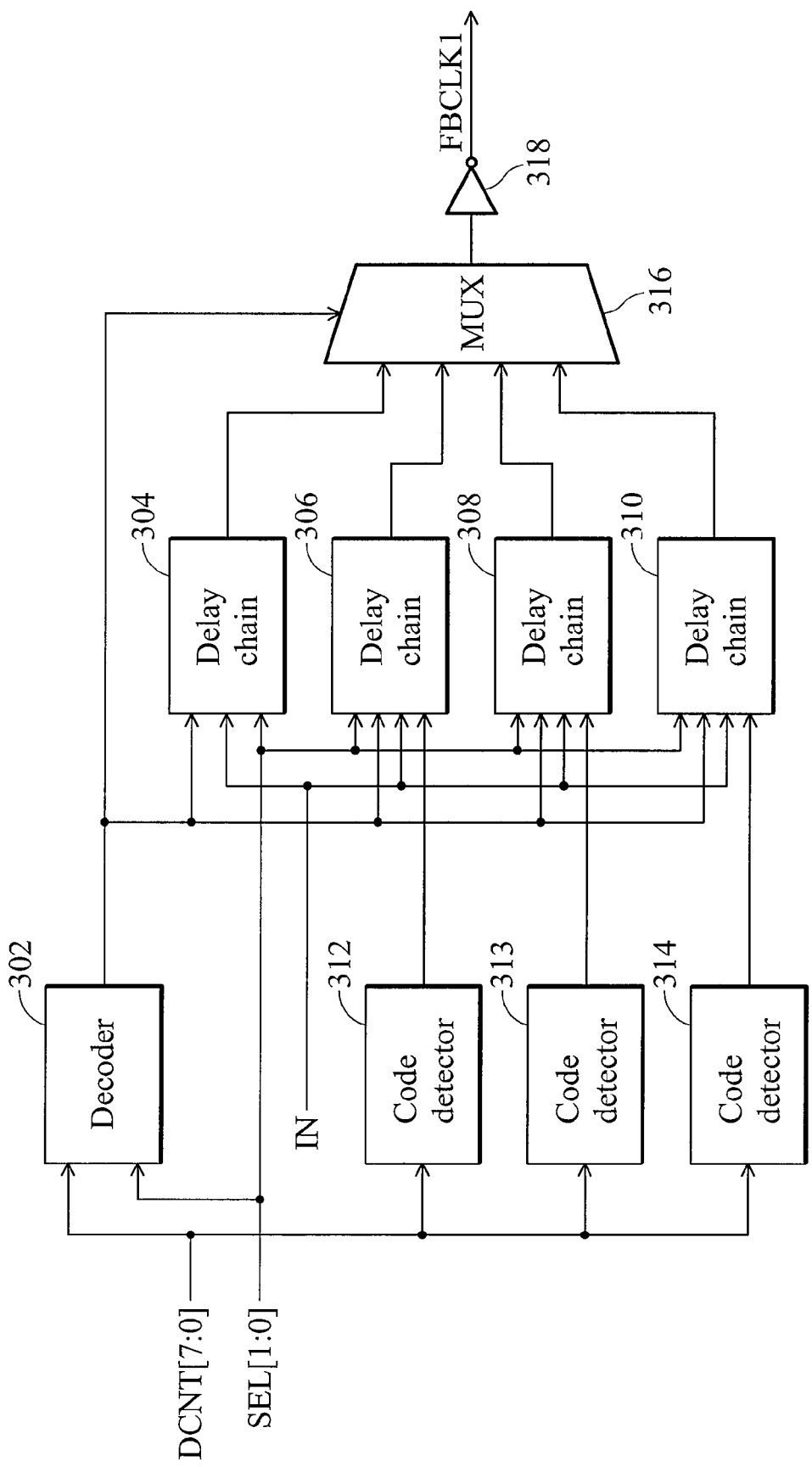
FIG. 3 is a circuit diagram of the delay component in FIG. 2.

FIG. 3 is a circuit diagram of the delay component 210 in FIG. 2. The delay component 210 includes a decoder 302, a plurality of delay chains 304, 306, 308, and 310, a plurality of code detectors 312, 313, and 314, a MUX 316, and an output buffer 318. Each delay chain corresponds to a different operational band of the input clock. The configuration of the delay chains is provided in the following. There are 128, 64, 32, and 16 delay units in the delay chains 304, 306, 308, and 310, respectively. In other words, the delay chains 304, 306, 308, and 310 map to the lowest, second lowest, second highest, and highest operational bands, respectively. Please note that each delay chain only needs to provide one operational band different from the others and the arrangement from low to high bands is given as an example. The number of delay units in each delay chain is determined according to the corresponding operational band. The higher the operational band, the fewer number of delay units. In other words, the lower the operational band, the more number of delay units.

The decoder 302 decodes the count value DCNT[7:0] and generates a decoded signal to control a plurality of delay chains to respectively delay the input clock IN to output a plurality of temporary delay clocks corresponding to different delay quantities. The decoder 302 further controls the MUX 316 to select a proper temporary delay clock corresponding to the operational frequency of the input clock IN. The output buffer 318 then outputs the needed delay clock.

Since the count value DCNT[7:0] of the counter 208 matches the lowest-frequency of the delay chain 304 (comprising 128 delay units), the counter 208 can count from 0 to 127. The count value DCNT[7:0] of the counter 208, however, does not match with the other delay chains (306, 308, and 310) and may cause abnormal operation. For example, since there are only 64 delay units in the delay chain 306, the count value DCNT[7:0] can only count from 0 to 63. Once the count value DCNT[7:0] is over 63, the corresponding decoded signal overflows. Similarly, delay chains 308 and 310 also have the overflow problem. Hence, the improved delay component of the invention utilizes a plurality of code detectors 312, 313, and 314 to solve the overflow problem in high band delay chains. For the delay chain 306, once the count value DCNT[7:0] is over 63, the code detector 312 generates a detected signal to decrease the delay quantity of the delay clock when the count value DCNT[7:0] increases. Hence the overflow problem is solved. Similarly, the code detectors 313 and 314 are respectively utilized to solve the overflow problem of delay chains 308 and 310. Finally, the decoder can correctly control each delay chain with the help of the plurality of code detectors.

Compared with the related art, the DLL of the invention does not need to increase the operating frequency of the input clock two times. Additionally, for a wideband delay component, the DLL of the invention can utilize a common counter to cooperate with each delay chain normally rather than adding counters.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A delay locked loop (DLL) for delaying an input clock to lock a delay clock comprising:

a frequency divider for dividing a frequency of the input clock by a number N to obtain a frequency-divided clock;

a plurality of delay components for delaying the input clock to generate a plurality of delay clocks with different phase according to a count value;

a phase detector coupled to a final delay component of the delay components for detecting a phase transition between a final delay clock of the delay clocks and the input clock; and a counter coupled to the phase detector and the frequency divider for generating the count value according to the phase transition between the final delay clock and the input clock to control a delay quantity of each of the plurality of the delay components;

wherein the final delay clock from the final delay component lags 180 degrees behind the input clock after locking, and wherein the delay component comprises:

a decoder for decoding the count value to generate a decoded signal;

a plurality of code detectors for respectively detecting the count value to generate a plurality of detected signals;

a plurality of delay chains respectively coupled to the decoder and the plurality of code detectors for delaying the input clock according to the plurality of detected signals and the decoded signal to generate a plurality of temporary delay clocks corresponding to different delay quantities;

a second MUX coupled to the decoder and the plurality of delay chains for choosing one from the plurality of temporary delay clocks according to the decoded signal as the delay clock corresponding to the frequency of the input clock; and an output buffer coupled to the second MUX for outputting the delay clock.

2. The DLL according to claim 1, wherein the plurality of delay components comprise a first delay component and a second delay component, wherein a first delay clock from the first delay component lags 90 degrees behind the input clock, the final delay clock from the second delay component lags 180 degrees behind the input clock, and the DLL outputs the first delay clock.

3. The DLL according to claim 1, wherein a lowest-frequency delay chain of the plurality of delay chains controls the delay quantity of the input clock according to the decoded signal to generate a lowest-frequency temporary delay clock, other delay chains of the plurality of delay chains control the delay quantity of the input clock according to the decoded signal and the corresponding detected signals.

4. The DLL according to claim 1, wherein when the decoded signal causes a specific delay chain overflow, a corresponding detected signal is generated to decrease the delay quantity of the temporary delay clock of the specific delay chain.

5. The DLL according to claim 1 further comprising a first multiplexer (MUX) coupled to the frequency divider, the phase detector, and the plurality of delay components for choosing one from a plurality of clocks with different frequencies as the input clock.

6. A broadband delay component for delaying an input clock to generate a delay clock according to a count value, the broadband delay component comprising:

a decoder for decoding the count value to generate a decoded signal;

a plurality of code detectors for respectively detecting the count value to generate a plurality of detected signals;

a plurality of delay chains respectively coupled to the decoder and the plurality of code detectors for delaying the input clock according to the plurality of detected signals and the decoded signal to generate a plurality of temporary delay clocks corresponding to different delay quantities;

a MUX coupled to the decoder and the plurality of delay chains for choosing one from the plurality of temporary delay clocks according to the decoded signal as the delay clock corresponding to the frequency of the input clock; and an output buffer coupled to the MUX for outputting the delay clock.

7. The broadband delay component according to claim 6, wherein a lowest-frequency delay chain of the plurality of delay chains controls the delay quantity of the input clock according to the decoded signal to generate a lowest-frequency temporary delay clock, other delay chains of the plurality of delay chains control the delay quantity of the input clock according to the decoded signal and the corresponding detected signals.

8. The broadband delay component according to claim 6, wherein when the decoded signal causes a specific delay chain overflow, a corresponding detected signal is generated to decrease the delay quantity of the temporary delay clock of the specific delay chain.

9. A method for delaying an input clock to lock a delay clock comprising:

dividing a frequency of the input clock by a number N to obtain a frequency-divided clock;

delaying the input clock to generate a plurality of delay clocks with different phases according to a count value;

detecting a phase transition between a final delay clock of the delay clocks and the input clock; and generating the count value according to the phase transition between the final delay clock and the input clock to control a delay quantity of each of the plurality of the delay components;

wherein the final delay clock lags 180 degrees behind the input clock after locking, and wherein the step of delaying the input clock further comprises:

decoding the count value to generate a decoded signal;

generating a plurality of detected signals according to the count value;

delaying the input clock according to the plurality of detected signals and the decoded signal to generate a plurality of temporary delay clocks corresponding to different delay quantities;

choosing one from the plurality of temporary delay clocks according to the decoded signal as the delay clock corresponding to the frequency of the input clock; and outputting the delay clock.

10. The method as claimed in claim 9, wherein the plurality of delay clocks comprise a first delay clock and a final delay clock, the first delay clock lags 90 degrees behind the input clock, the final delay clock lags 180 degrees behind the input clock.

11. The method as claimed in claim 9, wherein the delay quantity of the input clock is controlled by a lowest-frequency delay chain of the plurality of delay chains according to the decoded signal to generate a lowest-frequency temporary delay clock, and the delay quantity of the input clock is controlled by other delay chains of the plurality of delay chains according to the decoded signal and the corresponding detected signals.

12. The method as claimed in claim 9 further comprising choosing one from a plurality of clocks with different frequencies as the input clock.

* * * * *